United States Patent [19]
Patel

[11] Patent Number: 6,040,617
[45] Date of Patent: Mar. 21, 2000

[54] STRUCTURE TO PROVIDE JUNCTION BREAKDOWN STABILITY FOR DEEP TRENCH DEVICES

[75] Inventor: Viren C. Patel, Belle Meade, N.J.

[73] Assignee: STMicroelectronics, Inc., Carrollton, Tex.

[21] Appl. No.: 07/995,582

[22] Filed: Dec. 22, 1992

[51] Int. Cl.[7] .................. H01L 27/082; H01L 29/861; H01L 23/58; H01L 29/00
[52] U.S. Cl. .................. 257/571; 257/104; 257/106; 257/496; 257/513; 257/514; 257/515; 257/592; 257/594; 257/604; 257/605
[58] Field of Search .................. 257/104, 106, 257/492, 493, 497, 498, 496, 510, 513, 514, 515, 517, 519, 571, 589, 592, 594, 603, 604, 605, 606, 647, 648, 652, 629, 653, 910

[56] References Cited

U.S. PATENT DOCUMENTS

| Re. 28,653 | 12/1975 | Murphy | 257/604 |
| 4,153,904 | 5/1979 | Tasch, Jr. et al. | 257/652 |

FOREIGN PATENT DOCUMENTS

| 0 604 163 A2 | 12/1993 | European Pat. Off. | 257/571 |
| 2 557367 | 6/1985 | France | 257/571 |
| 0 519 268 A2 | 6/1992 | Germany | 257/571 |
| 51-47666 | 4/1976 | Japan | 257/571 |
| 52-131 478 | 11/1977 | Japan | 257/571 |
| 2 207 803 | 2/1989 | United Kingdom | 257/571 |

OTHER PUBLICATIONS

Yuk L. Tsang and John M. Aitken, "Junction Breakdown Instabilities in Deep Trench Isolation Structures," IEEE Transactions on Electron Devices, vol. 38, No. 9, Sep. 1991, pp. 2134–2138.

*Primary Examiner*—Steven H. Loke
*Attorney, Agent, or Firm*—Theodore E. Galanthay; Lisa K. Jorgenson; Renee M. Larson

[57] ABSTRACT

The present invention is directed to an improved deep trench structure, for use in junction devices, which addresses junction breakdown voltage instabilities of the prior art. The primary, or metallurgical, junction where avalanche breakdown occurs is moved away from the surface dielectric into the bulk silicon by adding a lightly doped layer adjacent to the deep trench. A preferred embodiment suitable for isolated structures places the doped layer adjacent to the sidewalls of the deep trench. A second preferred embodiment, suitable for non-isolated structures, places the doped layer adjacent to both the floor and the sidewalls of the trench.

16 Claims, 1 Drawing Sheet

# STRUCTURE TO PROVIDE JUNCTION BREAKDOWN STABILITY FOR DEEP TRENCH DEVICES

BACKGROUND OF THE INVENTION

1. Field of the Invention

The present invention relates generally to devices which employ deep trenches, possibly for isolation, and more specifically to a structure to provide junction breakdown stability for deep trench devices.

2. Description of the Prior Art

Deep trench structures are attractive because of the improved density and performance they provide when used in high speed junction devices. They may be used in both isolated and non-isolated discrete devices depending on circuit requirements. Typical devices which employ isolated and non-isolated deep trench structures include transistors and diodes as well as a host of other junction devices.

Deep trench structures form plane junctions which have higher junction breakdown voltages than do planar structures. However, they have the same junction breakdown voltage instability problem that planar junction structures possess. This instability, often referred to as "walkout", results when oxide-passivated junctions are subjected to conditions which cause avalanche breakdown. This phenomenon occurs in both planar and deep trench structures and is time dependent; the breakdown voltage increases with the amount of avalanche current present and the time current flows through the junction.

Junction breakdown voltage instabilities are caused by surface effects. In deep trench structures, the primary, or metallurgical, junction terminates on the surface. Oxide passivated surfaces cause junction breakdown voltage instabilities because they trap charges in the sidewall dielectric (in this case, oxide). The increase in breakdown voltage is attributed to the injection of charges into the dielectric and a portion of the charges subsequently becoming trapped in the oxide.

As a result of charges being trapped in the oxide, the electric field decreases and the junction breakdown voltage increases to compensate for the trapped positive charge. High fields exist at the metallurgical junction where the junction breakdown occurs. These fields generate enough energy to inject charges into the oxide where some of the charges are trapped. This affects surface fields, which in turn destabilizes junction breakdown voltage.

SUMMARY OF THE INVENTION

It is therefore an object of this invention to provide a deep trench structure which minimizes or eliminates junction breakdown voltage instability due to surface phenomenon.

The present invention is directed to an improved deep trench structure, for use in junction devices, which addresses junction breakdown voltage instabilities of the prior art. The point at which the primary, or metallurgical, junction experiences avalanche breakdown is moved away from the surface dielectric into the bulk silicon by adding a lightly doped layer adjacent to the deep trench. A preferred embodiment suitable for isolated structures places the doped layer adjacent to the sidewalls of the deep trench. A second preferred embodiment, suitable for non-isolated structures, places the doped layer adjacent to both the floor and the sidewalls of the trench.

BRIEF DESCRIPTION OF THE DRAWINGS

The invention itself as well as a preferred mode of use, and further objects and advantages thereof, will best be understood by reference to the following detailed description of an illustrative embodiment when read in conjunction with the accompanying drawings, wherein.

DESCRIPTION OF THE PREFERRED EMBODIMENT

Figure 1:
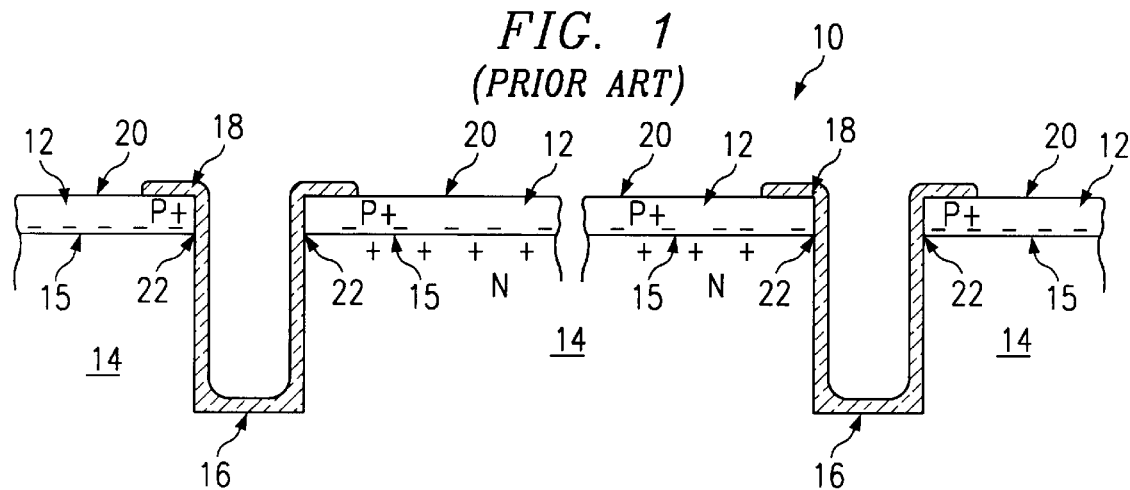
FIG. 1 is a deep trench structure according to the prior art.

Referring to FIG. 1, a deep trench isolation structure 10 according to the prior art is shown. $P^+$ region 12 is separated from N region 14 by $P^+N$ junction 15, the primary or metallurgical junction. Deep trench 16 covered with dielectric oxide layer 18, meets $P^+N$ junction 15 at point 22. Since oxide passivated junctions subjected to avalanche breakdown cause junction breakdown voltage instability over time, the fact that $P^+N$ junction 15 terminates on the surface at point 22 and that avalanche breakdown occurs in $P^+N$ junction 15 at the surface at point 22 means that junction breakdown voltage instability occurs. Junction breakdown voltage increases with the value of the avalanche current and the amount of time the current flows through the junction.

This increase in breakdown voltage instability is attributed to the injection of charges into the oxide dielectric, and a portion of the charges being subsequently trapped in the oxide. As a result of carriers being trapped in the oxide, the electric field decreases and the junction breakdown voltage increases to compensate for the trapped positive charge. Even though junction breakdown voltage increases in deep trench structures, once avalanche breakdown happens, "walkout" still does occur. Hence, it is detrimental for $P^+N$ junction 15 to meet surface 20 on the sidewall of trench 16.

Figure 2:
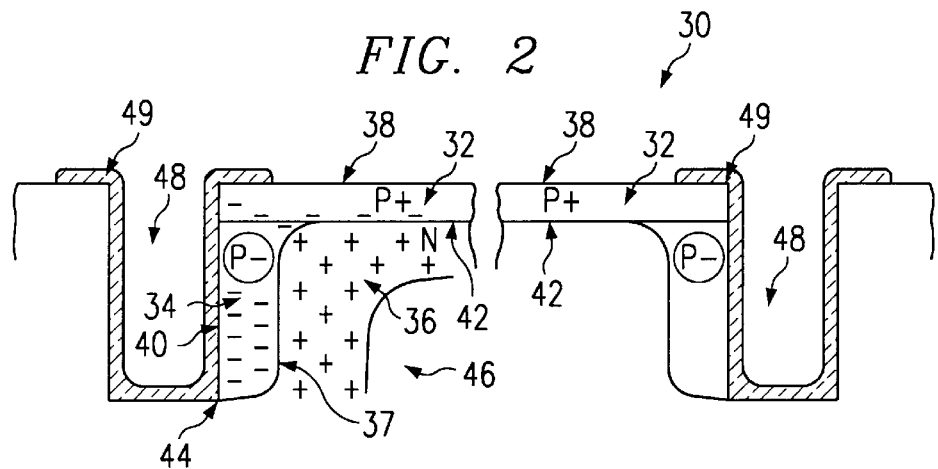
FIG. 2 is a deep trench isolation structure according to a first preferred embodiment of the present invention.

The present invention addresses this junction breakdown voltage instability inherent to prior art deep trench structures. FIG. 2 shows transistor structure 30 according to the present invention. Below silicon surface 38, $P^+$ base region 32 is adjacent to $P^-$ region 34 which has a lower dopant concentration and acts as a buffer region, shifting $P^+N$ junction 42 towards bulk silicon region 46, away from the surface of sidewall 40. This use of $^-$ P region 34 isolates the $P^+N$ junction from surface 38. The invention positions $P^+N$ junction 42 such that the high fields do not occur at the oxide/PN junction interface. Further, the cylindrical and/or spherical curvature of $P^+N$ junction 42 formed by this structure is such that depletion zone 36 in the N region is maximized. The shape of $P^+N$ junction 42 is different from the prior art of planar junctions where the cylindrical and/or spherical junction is such that depletion zone 36 is pinched, leading to premature junction breakdown in the pinched area. As is well known in the art, $P^+$ base region 32 represents a first polarity region, while N region 36 represents a second polarity region.

Because of the addition of $P^-$ region 34 adjacent to sidewall 40 of trench 48, $P^-N$ junction 37 meets the surface oxide 49 at point 44 away from $P^+N$ junction 42. Here the electric fields are lower than at $P^+N$ junction 42. The low fields do not generate enough energy to inject and then trap charges in the oxide which can cause instabilities. Thus, the device has a more stable breakdown voltage than in the prior art. The presence of $P^-N$ junction 44 having a lower concentration as compared to $P^+N$ junction 42 significantly reduces charge buildup in the dielectric and therefore has virtually no effect on junction stability due to trapped charges.

Also, because P+ base region 32 is adjacent to P− buffer region 34 which has a lower dopant concentration than P+ base region 32, the perimeter of P+ base region 32 may rest on top of P− buffer region 34 as shown in FIG. 2. Similarly, for a diode structure having a first polarity region and a second polarity region where the first polarity region is adjacent to a buffer region which has a lower dopant concentration than the first polarity region, the perimeter of the first polarity region may rest on top of the buffer region.

Figure 3:
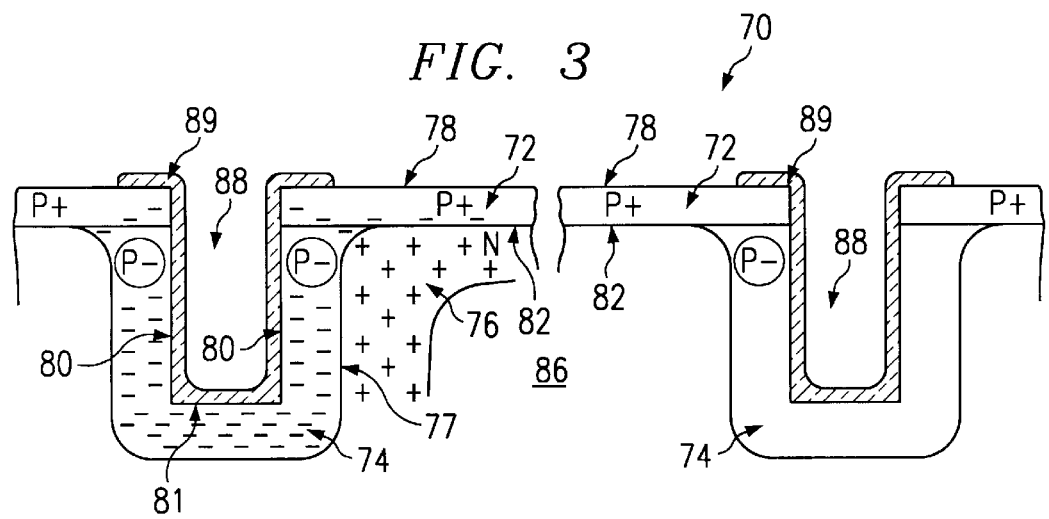
FIG. 3 is a non-isolated deep trench structure according to a second preferred embodiment of the present invention.

FIG. 3 shows a non-isolated deep trench structure according to a second preferred embodiment of the present invention. This embodiment may be utilized when isolation is not a consideration. Below silicon surface 78, P+ base region 72 is adjacent to P− region 74 which acts as a buffer region, shifting P+N junction 82 towards bulk silicon region 86, away from the surface of sidewalls 80 and floor 81, such that depletion zone 76 in the N region is maximized. P− layer 74 is wrapped around both sidewalls 80 and floor 81 of trench 88 such that it is adjacent to sidewalls 80 and floor 81. As a result, the secondary P−N junction 77 does not terminate on oxide 89 covered surface 78. No electrical fields are generated and it is not necessary to be concerned about charges being injected and then trapped in the oxide dielectric. This has the affect of eliminating junction breakdown voltage instability or "walkout" while also possibly increasing the breakdown voltage of the structure.

In order to address the deep trench junction breakdown voltage instabilities caused by adverse surface effects, the present invention moves the region where avalanche occurs in the primary, or metallurgical, junction (P+N) away from the dielectric covered surface into the bulk silicon by adding a lightly doped layer, such as P−, to the trench walls. For a transistor structure, the addition of P− buffer region creates a radius of curvature of P− N junction away from P+ base region and towards the collector region, such that the perimeter of the P+ base region rests on top of P− buffer region. Similarly, for a diode structure having a first polarity region and a second polarity region of opposite polarities, the addition of a buffer region adjacent to a first polarity region creates a radius of curvature of the diode junction between the first polarity region and the second polarity region away from the first polarity region and towards the second polarity region, such that the perimeter of the first polarity region rests on top of the buffer region. As a result, the secondary junction (P−N) meets the surface dielectric away from the primary junction (P+N), where the fields are lower than at the primary junction. The lower fields do not generate enough energy to inject and trap charges in the oxide; it is this injection and entrapment of charges in the oxide which causes junction breakdown voltage instabilities or "walkout".

While the invention has been particularly shown and described with reference to a first and a second preferred embodiment, it will be understood by those skilled in the art that various changes in form and detail may be made therein without departing from the spirit and scope of the invention.

The deep trench structure described herein is well suited for use in transistor structures, more specifically microwave power transistors, as well as diode structures where junction breakdown voltage instabilities occur. An example of diode applications is IMPATT diodes. It will be understood by those skilled in the art that there are other diode applications where the present invention may be utilized.

Additionally, in the case of transistors, the type of dopant used for either the base or collector regions is not fixed. For ease of explanation, the preferred embodiment discussed a P type base and a N type collector. However, the exact opposite type dopants may be used. It will also be understood that the transistor could be NPN or PNP.

What is claimed is:

1. A deep trench transistor structure which provides junction breakdown stability, comprising:
    a base region;
    a collector region surrounded by a buffer region, wherein the base region rests on top of the buffer region and the collector region;
    a deep trench having at least two vertical sidewalls and a floor, wherein the base region extends to a vertical sidewall of the deep trench; and
    a base-collector junction connecting the base region and the collector region, wherein the buffer region is located adjacent to the vertical sidewall, thereby shifting the base-collector junction towards the collector region and away from the vertical sidewall.

2. The structure of claim 1, wherein the perimeter of the base region rests on top of the buffer region.

3. The structure of claim 2, wherein the base region is comprised of a first type dopant material, the collector region is comprised of a second type dopant material, and wherein the first type dopant material and the second type dopant material are opposite dopant types.

4. The structure of claim 3, wherein the buffer region is comprised of the first type dopant material but at a lower dopant concentration than the concentration of the base region.

5. The structure of claim 4, wherein the deep trench transistor structure is suitable for isolated structures.

6. The structure of claim 4, wherein the deep trench transistor structure is suitable for non-isolated structures.

7. The structure of claim 6, wherein the buffer region is adjacent to the vertical sidewall and the floor of the trench.

8. The structure of claim 1, wherein the transistor structure is suitable for use in microwave power transistors.

9. A deep trench diode structure, comprising:
    a first polarity region;
    second polarity region, of opposite polarity to the first polarity region, surrounded by a buffer region, wherein the buffer region is of the same polarity as the first polarity region but at a lower dopant concentration than the first polarity region, and first polarity region rests on top of the buffer region and the second polarity region;
    a deep trench having at least two vertical sidewalls and a floor, wherein the first polarity region extends to a vertical sidewall of the deep trench; and
    a diode junction connecting the first polarity region and the second polarity region, wherein the buffer region is located adjacent to the vertical sidewall thereby shifting the diode junction away from the vertical sidewall and into the second polarity region.

10. The structure of claim 9, wherein the perimeter of the first polarity region rests on top of the buffer region.

11. The structure of claim 10, wherein the first polarity region is comprised of a first type dopant material, the second polarity region is comprised of a second type dopant material, and wherein the first type dopant material and the second type dopant material are opposite dopant types.

12. The structure of claim 11, wherein the buffer region is comprised of the first type dopant material but at a lower dopant concentration than the concentration of the first polarity region.

13. The structure of claim 12, wherein the deep trench diode structure is suitable for isolated structures.

14. The structure of claim 12, wherein the deep trench diode structure is suitable for non-isolated structures.

15. The structure of claim 14, wherein the buffer region is adjacent to the vertical sidewall and the floor of the trench.

16. The structure of claim 9, wherein the deep trench diode structure is suitable for use in IMPATT diodes.

* * * * *